US012188992B2

(12) United States Patent
Desabhatla et al.

(10) Patent No.: US 12,188,992 B2
(45) Date of Patent: Jan. 7, 2025

(54) SYSTEM AND METHOD FOR GROUND FAULT DETECTION OF STATIC STARTER CIRCUITRY

(71) Applicant: General Electric Company, Schenectady, NY (US)

(72) Inventors: Sreedhar Desabhatla, Garching (DE); Malepati Bhavani Sankar, Bengaluru (IN); John A. Leonard, Salem, VA (US); Sudeep Pathak, Hyderabad (IN)

(73) Assignee: GE Infrastructure Technology LLC, Greenville, SC (US)

( * ) Notice: Subject to any disclaimer, the term of this patent is extended or adjusted under 35 U.S.C. 154(b) by 154 days.

(21) Appl. No.: 17/969,634

(22) Filed: Oct. 19, 2022

(65) Prior Publication Data

US 2023/0417842 A1 Dec. 28, 2023

(30) Foreign Application Priority Data

Jun. 23, 2022 (IN) ............................ 202211036196

(51) Int. Cl.
*G01R 31/52* (2020.01)
*H02P 1/04* (2006.01)

(52) U.S. Cl.
CPC ................ *G01R 31/52* (2020.01); *H02P 1/04* (2013.01)

(58) Field of Classification Search
CPC ......... G01R 31/52; H02P 1/04; H02P 29/024; H02P 1/52; H02H 3/165
See application file for complete search history.

(56) References Cited

U.S. PATENT DOCUMENTS 4,019,120 A * 4/1977 Fattic ........................ H02J 7/16 340/645
5,699,219 A 12/1997 Arita et al.
6,025,980 A 2/2000 Morron et al.
9,735,696 B2 * 8/2017 Bhandarkar ........ H02M 5/4585
(Continued)

FOREIGN PATENT DOCUMENTS

KR 100785278 B1 12/2007

OTHER PUBLICATIONS

European extended Search Report of EP Application No. 23178219.4 dated Nov. 17, 2023; 9 pgs.
(Continued)

*Primary Examiner* — Christopher P McAndrew
*Assistant Examiner* — Zannatul Ferdous
(74) *Attorney, Agent, or Firm* — Fletcher Yoder, P.C.

(57) ABSTRACT

A system, in one embodiment, may include a system includes a ground fault detection system. The ground fault detection system includes a linear filter configured to receive one or more signals from a static starter system during operations of the static starter system and to produce a linear filter output. The ground fault detection system further includes a rectifier configured to rectify the linear filter output and to produce a rectifier output, and a gain system configured to multiply the rectifier output by a factor to produce a gain output. The ground fault detection system additionally includes a fault indicator system configured to indicate a ground fault based on the gain output, wherein the ground fault detection system is configured to command an action based on the ground fault.

20 Claims, 3 Drawing Sheets

(56) References Cited

U.S. PATENT DOCUMENTS

| | | | | |
|---|---|---|---|---|
| 2001/0040458 | A1 * | 11/2001 | Macbeth ................ | G01R 31/12 324/536 |
| 2011/0074391 | A1 * | 3/2011 | Bartlett .............. | G01R 1/06766 324/76.44 |
| 2012/0211981 | A1 * | 8/2012 | De Wergifosse .... | H02K 11/042 290/31 |
| 2014/0145727 | A1 * | 5/2014 | Ike ......................... | G01R 31/52 324/509 |

OTHER PUBLICATIONS

Power Systems Relaying Committee of the IEEE Power Engineering Society; "IEEE Guide for AC Generator Protection"; IEEE Std C37.102-2006 (Revison of IEEE Std C37.102-1995); IEEE Standard, IEEE, Piscataway, NJ, USA, Feb. 16, 2007 (Feb. 16, 2007), pp. 1-177, XP068132844 , DOI: 10.1109/IEEESTD.2007.8526571 ISBN: 978-0-7381-5250-9 [retrieved on Nov. 7, 2018].

* cited by examiner

SYSTEM AND METHOD FOR GROUND FAULT DETECTION OF STATIC STARTER CIRCUITRY

CROSS-REFERENCE TO RELATED APPLICATION

This application claims priority to and benefit of Indian Application No. 202211036196, filed on Jun. 23, 2022; entitled "SYSTEM AND METHOD FOR GROUND FAULT DETECTION OF STATIC STARTER CIRCUITRY", which is herein incorporated by reference in its entirety.

BACKGROUND

The subject matter disclosed herein relates generally to static starter circuitry and, more particularly, to systems and methods for determining a fault in the static starter circuitry.

In some gas turbine systems, a gas turbine may be started and accelerated to a desired speed profile. The speed profile may be one that provides desired starting conditions for the gas turbine. The speed profile may contain details of speed, current versus time, voltage versus time, and/or power versus time, that a system such as a load commutated inverter (LCI) system may provide to a generator along with other details relevant to starting the generator and the gas turbine system. In such applications, a static starter system may be provided in conjunction with an electrical generator acting as a synchronous motor, which may be operatively coupled to a shaft of the gas turbine. During the starting sequence of the gas turbine system, the static starter system may deliver a variable frequency current to drive and control the electrical generator (e.g., by modulating exciter field voltage and/or stator current), which in turn drives the main shaft of the gas turbine into rotation. The static starter system may disengage and electrically disconnect from the generator as the gas turbine enters normal (e.g., self-sustaining) operation. It may be useful to improve fault detection, including ground fault detection, in static starter systems.

BRIEF DESCRIPTION

In one embodiment a system includes a ground fault detection system. The ground fault detection system includes a linear filter configured to receive one or more signals from a static starter system during operations of the static starter system and to produce a linear filter output. The ground fault detection system further includes a rectifier configured to rectify the linear filter output and to produce a rectifier output, and a gain system configured to multiply the rectifier output by a factor to produce a gain output. The ground fault detection system additionally includes a fault indicator system configured to indicate a ground fault based on the gain output, wherein the ground fault detection system is configured to command an action based on the ground fault.

In another embodiment, a system includes a gas turbine, an electrical generator, and a static starter system. The static starter is configured to provide a variable frequency AC signal to drive the electrical generator during a starting sequence of the gas turbine. The system further includes a ground fault detection system configured to receive one or more signals from the static starter system during operations of the static starter system and to linearly filter the one or more signals to produce a linear filter output. The ground fault detection system is additionally configured to rectify the linear filter output to produce a rectified output and to apply a gain to the rectified output to produce a gain output. The ground fault detection system is further configured to derive a mean value from the gain output to produce a mean value output and to detect a ground fault based on the mean value output, wherein the ground fault detection system is configured to command an action based on the ground fault.

In a further embodiment, a method includes receiving one or more signals from a static starter system during operations of the static starter system, and linearly filtering the one or more signals to produce a linear filter output. The method additionally includes rectifying the linear filter output to produce a rectified output and applying a gain to the rectified output to produce a gain output. The method also includes detecting a ground fault based on the gain output, and tripping a system based on the detection of the ground fault.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
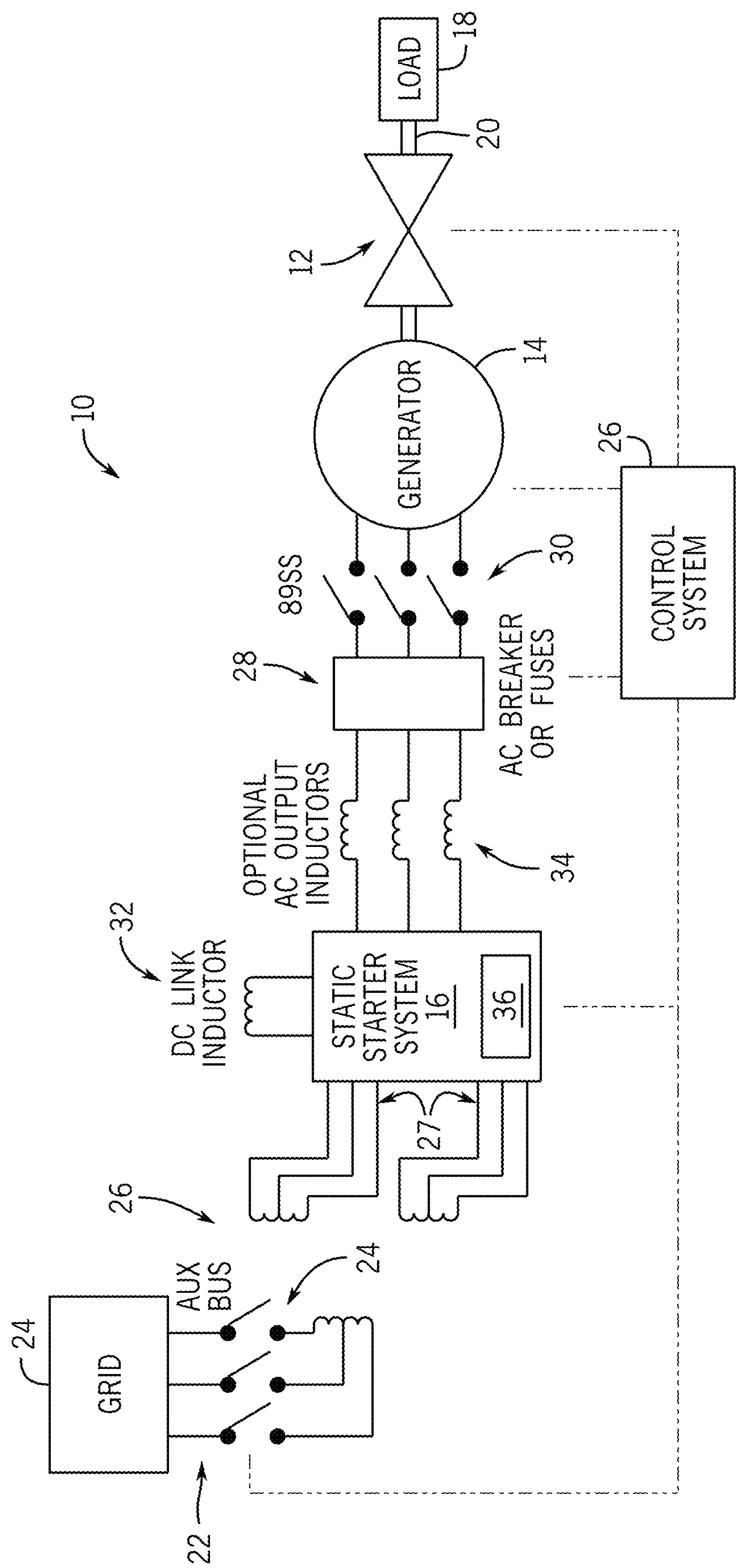
FIG. 1 is a block diagram depicting an embodiment of a turbine-generator system that includes a static starter system having a ground fault detection system.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As discussed further below, certain embodiments provide techniques for detecting certain faults (e.g., ground faults), in electrical systems such as static starter systems. Using the techniques further described below, a static starter system such as a load commutated inverter (LCI) system may include a ground detection system that may detect a signal at a virtual load side (e.g., generator side) neutral. For example, a generator neutral may be isolated from ground by opening a breaker/switch connected in series in a grounding arrangement during a static start sequence to protect neutral grounding transformer(s) from a possible direct current (DC) link ground fault on the LCI.

An improved system and/or process is described herein where a ground fault would be identified even with the breaker/switch closed and the generator neutral connected to ground. In certain embodiments, a ground fault on a DC link (e.g., when the breaker/switch is closed) may results in a 3rd harmonic current that flows in a generator neutral via a neutral grounding transformer (NGT). A false neutral voltage (FNV) may be used to detect the ground fault. During load commutation, the voltage signals that make up FNV may be calculated using three signals, e.g., three phase line-ground voltage signals. For example, the three phase line-ground voltage signals may be averaged to obtain the FNV. A trip would be initiated and certain blocks may be applied, for example, to a source Bridge and/or Load Bridge) of the LCI to limit the current flowing through the ground. These techniques may identify the ground fault in a few tens of milliseconds or less and would trip the LCI, for example before a core of the NGT or voltage transformer (VT) becomes saturated, which may result in excessive current flows when saturation of the core occurs. Accordingly, a more efficient ground fault detection for certain electrical systems, e.g., static starter systems, may be provided.

Turning now to FIG. 1, the figure is a simplified system diagram showing an embodiment of a turbine-generator system 10 that includes a gas turbine 12, a generator 14, and a static starter system 16. Before self-sustaining operation, a static starter may be used to power the gas turbine 12. In self-sustaining operation, combustion of fuel in the gas turbine 12 may cause one or more turbine blades of the gas turbine 12 to drive a main shaft 20 into rotation. As shown, the shaft 20 may be coupled to a load 18 that may be powered via rotation of the shaft 20. By way of example, the load 18 may be any suitable device that may generate power via the rotational output of the turbine-generator system such as an external mechanical load or a power generation plant. For instance, in some embodiments, the load 18 may include an electrical generator, a propeller of an airplane, and so forth.

During a starting sequence of the turbine-generator system 10 (e.g., when the turbine 12 is initially started up from a generally stationary position), the static starter system 16 may function as a variable speed AC drive system that drives the generator 14 as a synchronous motor. For instance, the static starter 16 may include a power conversion module that receives AC power from a source, such as power grid 24, via an AC bus 22, switches 24, and a transformer 26 (e.g., isolation transformer dual winding secondary delta or wye providing input power via conduits 27) and provides variable frequency AC power via AC breakers or fuses 28 and switches 30 to drive the generator 14. A DC link inductor system (e.g., DC link reactor) 32 is also shown, which may be used as an inductive bridge further described below. Optional AC output inductors 34 may also be used. Accordingly, the generator 14 and static starter 16 may operate collectively to accelerate the turbine 12 in accordance with a desired speed profile. For instance, in one embodiment, a desired starting condition may be one in which the turbine 12 reaches a speed such that it is capable of self-sustaining operation independent from the generator 14 and static starter 16 via its own combustion processes. Once a desired speed is achieved, the static starter system 16 may disengage from the generator 14 while the turbine 12 continues to operate independently of the static starter system 16. As can be appreciated, the use of static starter system 16 and generator 14 may be beneficial in that it reduces the need for a separate starting device, such as an electric motor or diesel engine, and also reduces the need for torque converters associated with such auxiliary hardware, thus not only reducing overall component cost, but also freeing up space in the vicinity of the turbine unit 12 and reducing the overall form factor of the turbine system 10.

Additionally, the static starter system 16 may include a ground fault system 36. The ground fault system 36 may detect a ground fault, for example, in the DC link inductor system 32, on a source side, e.g., source AC feeding into the static starter system 16, and/or on a load side, e.g., output side of the static starter system 16. The ground fault system 36 may further "trip" the static starter system 16 to stop any undesired effects of the ground fault in the static starter system 16 or in systems downstream from the static starter system 16 (e.g., transformers, load circuitry, and so on). The turbine-generator system 10 may also include a control logic or system 26, which may provide various control parameters to each of the turbine 12, the generator 14, and the static starter system 16. For instance, the control logic 26 may provide or generate firing commands for solid state semiconductor switching devices, such as thyristors, that may be included in the power conversion module of the static starter 12. As discussed further below, the control logic 26, in accordance with aspects of the present disclosure, may in some embodiments, work with and/or include the static starter system 16 to detect ground faults and to respond to the ground faults.

Figure 2:
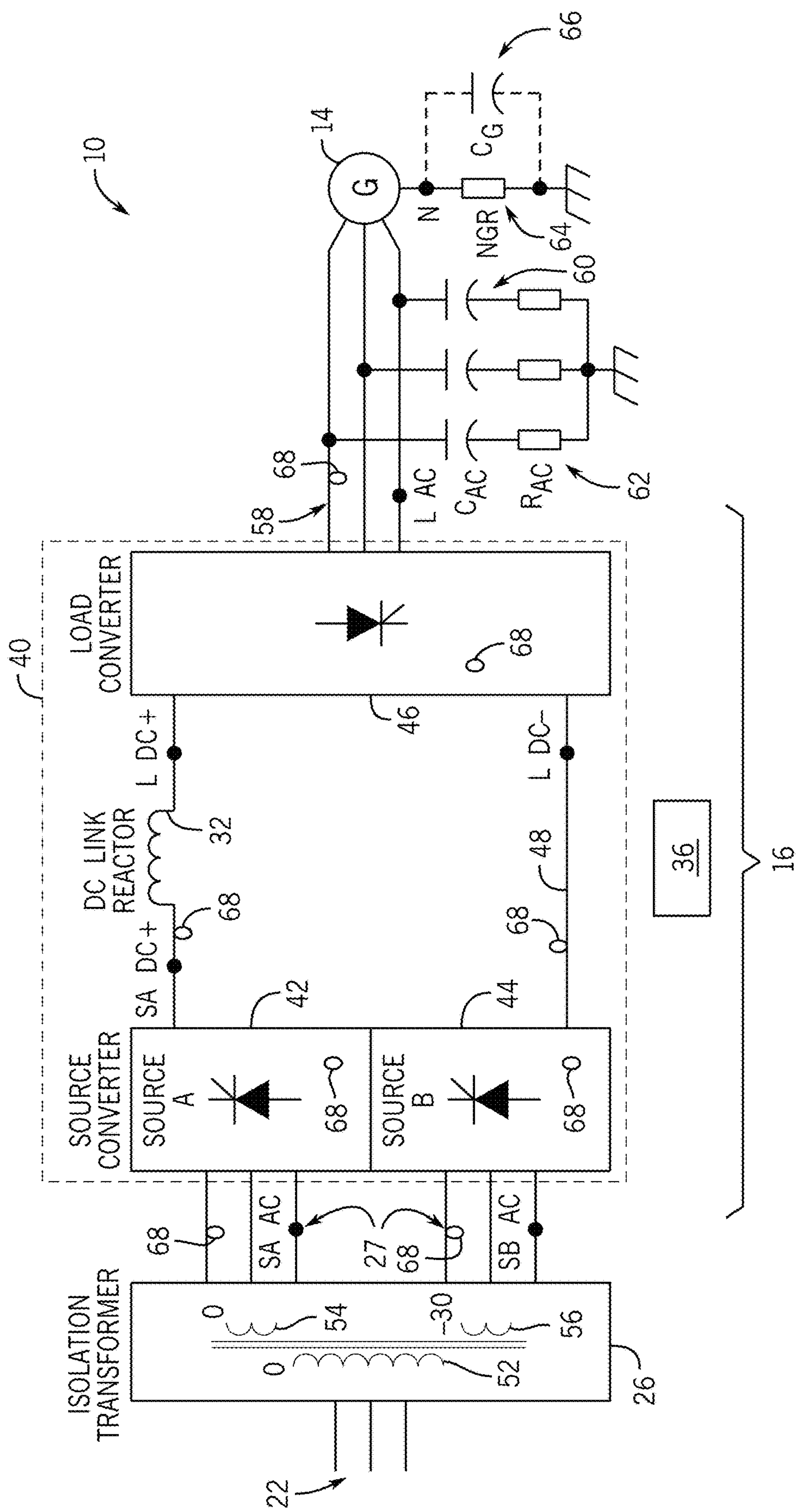
FIG. 2 is a block diagram illustrating the turbine-generator system of FIG. 1 in more detail.

Referring now to FIG. 2, the embodiment of the turbine-generator system 10 depicted in FIG. 1 is illustrated in further detail. Particularly, FIG. 2 depicts in further detail certain components that may be present in an embodiment of the static starter system 16 shown in FIG. 1. A static starter 16 or LCI is also known as SFC (Static Frequency Converter). As discussed above with reference to FIG. 1, during a starting sequence of the turbine-generator system 10, the static starter 16 may operate as a variable speed AC drive system to provide variable AC power to the generator 14. In the present embodiment, the static starter 16 may include a power conversion module 40 having two series-connected source bridge converters (e.g., rectifiers) 42, 44, a load bridge converter(s) (e.g., inverter) 46, and the DC link reactor 32. As shown, the source bridges 42, 44 feed the load bridge 46 through the DC link reactor 32 with positive DC voltage, and negative DC voltage is carried through a bus 48. The current techniques are equally applicable when the source side of static starter 16 has a single rectifier bridge. In case of the single rectifier bridge on source side, the isolation transformer 26, may have a single secondary instead of two delta-wye secondaries as shown in FIG. 2.

The main input power from the AC bus 22 to the power conversion module 40 may be provided through the isolation transformer 26 to deliver three-phase AC input power to each of the source bridges 42, 44. The isolation transformer 26, which may be connected to the AC bus 22 by a circuit breaker, may provide correct voltage and phasing to the input terminals of the source bridge rectifiers 42, 44, as well as isolation from the AC bus 22. As shown, three-phase AC power (e.g., from grid 24 of FIG. 1) is provided along the AC bus 22 to a primary winding 52 of the isolation transformer 26. The isolation transformer 26 also includes two secondary windings, including a secondary winding 54, which feeds the source bridge 42, and a secondary winding 56, which feeds the source bridge 44. In the present embodiment, this arrangement may result in the three-phase AC inputs to source bridge converter 44 being offset by 30 degrees, and may also reduce unwanted harmonics in the power conversion module 40. Having 30 degrees offset in voltages fed to rectifier bridges may also result in reduction of harmonics on the upstream of static starter.

The source bridges 42, 44 may be line-commutated and phase-controlled thyristor bridges that, upon receiving inputs from the secondary windings 54, 56, respectively, of the isolation transformer 26, produce a variable DC voltage output to the DC link reactor 32. The DC link reactor 32 may provide inductance to smooth the current provided by the source bridges 42, 44 and to keep the current continuous over the operating range of the system while also reducing harmonics. In one embodiment, the DC link reactor 32 may include an air core inductor. The output of the DC link reactor 32 may then be provided to the load bridge 46, which may be a load-commutated or force-commutated thyristor bridge configured to provide a variable frequency AC output, represented here by reference number 58. Accordingly, the static starter system 16 may be a load commutated inverter (LCI) system 16 suitable for use in starting the turbine system 12.

In the depicted embodiment, the generator 14 is connected to the outputs 58 and include certain capacitors 60 and resistors 62 that may be grounded. Likewise, the generator 14 may also include neutral ground resistor(s) 64 and capacitors 66 leading to ground. In some embodiments, a neutral grounding transformer (NGT) may also be used. The static starter system 16 may include one or more sensors 68 that may be communicatively coupled to the ground fault detection system 36. The sensors 68 may sense inductance, resistance, capacitance, voltage, amperage, frequency, or a combination thereof. In one embodiment, the ground fault detection system 36 may use a linear filter, such as a recursive linear filter, to analyze certain signals during use of the static starter system 16 to determine if a ground fault condition is occurring, as further described below.

Figure 3:
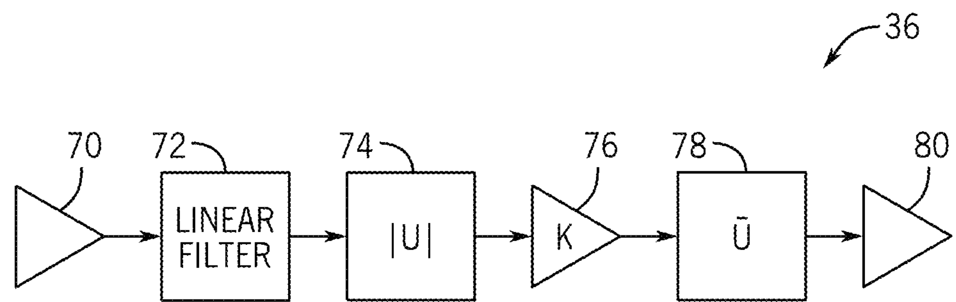
FIG. 3 is a block diagram of and embodiment the ground fault detection system of FIG. 2 that may be used to detect a ground fault.

FIG. 3 is a block diagram of and embodiment the ground fault detection system 36 that may be used to detect a ground fault in the DC link inductor system 32, on a source side, e.g., source AC 27 feeding into the static starter system 16, and/or on a load side, e.g., output side 58 of the static starter system 16. In the depicted embodiment, an input 70 may include voltage signals, such as a false neutral voltage (FNV) having voltage signals that may contain multiple different frequency components. The voltage signals that make up FNV may be calculated using three signals, e.g., three phase line-ground voltage signals. For example, the three phase line-ground voltage signals may be averaged to obtain the FNV. The input 70 may be processed by a linear filter 72, such as recursive filter. In some embodiments, the linear filter 72 is a filter that is tuned to allow approximately between 2 to 4 times the load frequency. In an exemplary embodiment, the biquad filter allows 3 times the load frequency. The output of the linear filter 72 may then be processed by a full cycle rectifier 74, which takes the absolute value of the linear filter's output and passes it on to a gain system 76. The gain system 76 then applies a gain K, e.g., multiplies the absolute value in system 74 by a gain K. The gain K may be between 1 and 5, and in an exemplary embodiment, the gain K may be $$\text{Gain } K = \frac{4\pi}{3\sqrt{2}} \times \sqrt{\frac{2}{3}} \times \frac{\pi}{2} = \frac{2\pi^2}{3\sqrt{3}}$$

The output of the gain system 76 may then be used by a mean value \integrator system 78 to derive a mean (e.g., statistical mean) based on a certain number of samples. That is, the two or more outputs of system 76 may be stored in memory and then the mean of the stored outputs may then be calculated in system 78. The calculated mean may then be used to derive a fault indication via a fault indicator 80. For example, the calculated mean (block 78) may be compared against a value (or range of values) and if the calculated mean exceeds the value (or range of values) then a fault may be indicated. In some embodiments, instead of using the calculated mean, block 78 may integrate the output(s) of system 78 over a period (e.g., base frequency) and wait a number of cycles (e.g., wait 2, 3, 4, 5, 6, or more cycles) to initiate a fault or a trip condition. Thus, in the depicted embodiment a fault indicator (FI) value may be calculated after the gain K 76 has been applied. If a ground fault is detected the ground fault may then be used to disconnect, for example, the power conversion module 40, components of the power conversion 40, input power to power conversion module 40, output power to power conversion module 40, or a combination thereof. An operator may also be notified of the ground fault.

As mentioned earlier, the linear filter 72 may be a biquad filter in some embodiments. When using a biquad filter, a continuous time transfer function and/or a discrete time transfer function may be used. In an exemplary embodiment, the continuous time transfer function may be $$\frac{2d\omega s}{s^2 + 2d\omega s + \omega^2}$$

where d=0.05, $\omega=2\pi\times3f_{inv}$ and T is the sampling rate of the circuitry used to sample input 70. In an exemplary embodiment, the discrete time transfer function may be $$H(z) = \frac{k_2 z^2 + k_1 z + k_0}{i_2 z^2 + i_1 z + i_0}$$

where $$k_0 = -2\times d\times\omega\times\left(\frac{2}{T}\right),\ k_1 = 0,\ k_2 = 2\times d\times\omega\times\left(\frac{2}{T}\right),\ i_0 = \left(\frac{2}{T}\right)^2 - 2\times d\times\omega\times\left(\frac{2}{T}\right) + \omega^2,\ i_1 = -2\times\left(\frac{2}{T}\right)^2 + 2\times\omega^2;\ i_2 = \left(\frac{2}{T}\right)^2 + 2\times d\times\omega\times\left(\frac{2}{T}\right) + \omega^2,$$

and z is in a z domain (e.g., Z-transform that converts a discrete-time signal, which is a sequence of real or complex numbers, into a complex frequency-domain representation, and can be considered as a discrete-time equivalent of the Laplace transform). The variable 'd' in the transfer function of the biquad filter has an ability to control the amount of delay introduced by the filter 72. Increasing d reduces the selectivity of the filter 72 and also reduces the delay introduced by the filter 72. Inversely, decreasing d increases the selectivity of the filter 72 and also increases the delay introduced by the filter 72. For calculating the average value of the signal $\bar{u}$, a moving average with some window size b may be used. In one embodiment, a more optimal size b, $b_{opt}$, of the moving average block may dependent on the frequency of the signal at the output of the biquad filter and it is given by $$b_{opt} = \frac{1}{2 \times 3 f_{inv}}.$$

The ground fault detection system 36 may be implemented using hardware (e.g., suitably configured circuitry), software (e.g., via a computer program including executable code stored on one or more tangible computer readable medium), or via using a combination of both hardware and software elements. For example, the ground fault detection system 36 may be implemented as a circuit operatively and/or communicatively connected or included in the control system 26. Similarly the ground fault detection system 36 may be implemented in software executable via the control system 26. Additionally or alternatively, the ground fault detection system 26 may be implemented as a combination of circuitry and software that may be operatively and/or communicatively connected to the control system 26.

Figure 4:
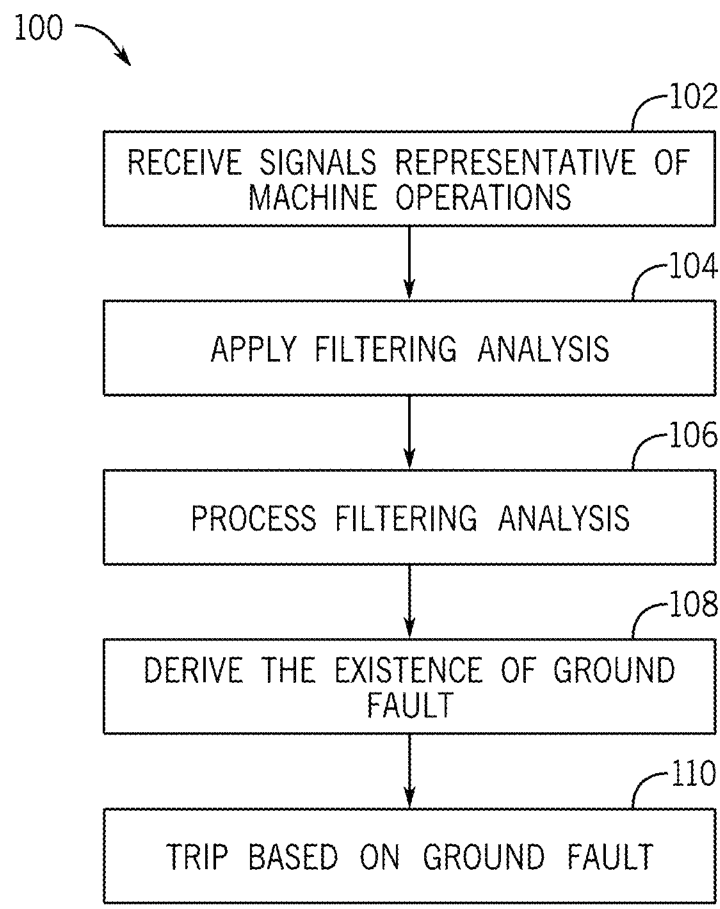
FIG. 4 is a flowchart of an embodiment of a process suitable for deriving a ground fault in certain machinery.

FIG. 4 is a flowchart of an embodiment of a process 100 suitable for deriving a ground fault in certain machinery, for example, in the static starter system 16. The process 100 may be implemented as circuitry and or computer code, for example, via the ground fault detection system 36. In the depicted embodiment, the process 100 may receive (block 102) signals representative of machine operations, such as operations of the static starter system 16. As mentioned above, the signals may include signals from the inputs 27, DC link reactor 32, bridge converters (e.g., rectifiers) 42, 44, load bridge converter (e.g., inverter) 46, bus 48, outputs 58, or a combination thereof. The signals may be sensor 68 signals representative of inductance, resistance, capacitance, voltage, amperage, frequency, or a combination thereof.

The process 100 may then apply (block 102) a filtering analysis to the signals. For example, the linear filter 72 (e.g., biquad filter) may be used to filter out the signals. The result of the filtering (block 102) may be, for example, a filtered frequency signal, such as a filtered load frequency signal. In certain embodiments, the filtering allows 3 times the load frequency. The process 100 may then process (block 106), the results of the filtering analysis. In one embodiment, the filtering may be further processed (block 106), for example, by taking an absolute value of the filtering output, then applying a gain k as described above to the absolute value, and then further finding a mean of two or more absolute values.

The process 100 may then derive (block 108) the existence of a ground fault. In certain embodiments, the ground fault may be derived (block 108) by using a fault indicator (FI) value resulting from the application of the gain k. If the FI exceeds a threshold value then a ground fault may be found. The process 100 may then act on the derivation of a ground fault, for example, by tripping (block 110) certain equipment, such as opening switches to turn off the inputs 27 and/or outputs 58. By applying a filtering analysis and processing, the techniques described herein may find a ground fault more quickly and minimize or eliminate false positives/negatives.

As will be understood, the various techniques described above and relating to the monitoring and detecting of the conductive state of solid state semiconductor switches are provided herein by way of example only. Accordingly, it should be understood that the present disclosure should not be construed as being limited to only the examples provided above. Indeed, a number of variations of the detection logic and techniques set forth above may exist. Further, it should be appreciated that the above-discussed techniques may be implemented in any suitable manner. For instance, the detection system 36 may be implemented using hardware (e.g., suitably configured circuitry), software (e.g., via a computer program including executable code stored on one or more tangible computer readable medium), or via using a combination of both hardware and software elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A ground fault detection system, comprising:

a linear filter configured to receive as input one or more signals from a static starter system during operations of the static starter system and to produce a linear filter output, wherein the linear filter comprises a recursive linear filter having poles and zeroes tuned to allow a selected frequency component from the input, the selected frequency component is between 2 to 5 times a load frequency, the input comprises a false neutral voltage (FNV) signal, and the linear filter comprises a biquad filter;

a rectifier configured to rectify the linear filter output and to produce a rectifier output;

a gain system configured to multiply the rectifier output by a factor to produce a gain output; and a fault indicator system configured to indicate a ground fault based on the gain output, wherein the ground fault detection system is configured to command an action based on the ground fault.

2. The ground fault detection system of claim 1, wherein the factor comprises $$K = \frac{4\pi}{3\sqrt{2}} \times \sqrt{\frac{2}{3}} \times \frac{\pi}{2} = \frac{2\pi^2}{3\sqrt{3}}.$$

3. The ground fault detection system of claim 1, wherein the FNV signal comprises voltage signals having multiple different frequency components, and the FNV is based on three phase voltage signals.

4. The ground fault detection system of claim 1, wherein the linear filter comprises a continuous time transfer function, a discrete time transfer function, or a combination thereof.

5. The ground fault detection system of claim 1, comprising a mean value\integrator system configured to receive the gain output and to provide a mean value output to the fault indicator system, and/or configured to integrate the gain output over a period and wait at least 2 cycles to provide a fault indication output to the fault indicator system.

6. The ground fault detection system of claim 1, wherein the static starter system comprises a power module comprising a direct current (DC) link reactor, wherein the power module comprises one or more source bridge converters, one or more load bridges, or at least two busses, and wherein the one or more signals are incoming from the one or more source bridge converters, the one or more load bridges, or the at least two busses.

7. The ground fault detection system of claim 1, wherein the factor is greater than 1.

8. The ground fault detection system of claim 1, wherein the action comprises tripping the static starter system, an external system electrically coupled to the static starter system, or a combination thereof.

9. The ground fault detection system of claim 1, wherein the static starter system is electrically coupled to an electrical generator, the electrical generator is mechanically coupled to the turbine system, and wherein the static starter system is configured to participate in starting the turbine system via the electrical generator.

10. A system, comprising:

a turbine;

an electrical generator or a motor;

a static starter system configured to provide a variable frequency AC signal to drive the electrical generator or the motor during a starting sequence of the turbine; and a ground fault detection system configured to:

receive one or more signals from the static starter system during operations of the static starter system;

linearly filter the one or more signals via a linear filter to produce a linear filter output, wherein the linear filter comprises a recursive linear filter having poles and zeroes tuned to allow a selected frequency component from the input, the selected frequency component is between 2 to 5 times a load frequency, the input comprises a false neutral voltage (FNV) signal, and the linear filter comprises a biquad filter;

rectify the linear filter output to produce a rectified output;

apply a gain to the rectified output to produce a gain output;

derive a mean value and/or an integrated value from the gain output to produce a mean value output and/or an integrated value output; and detect a ground fault based on the mean value output and/or the integrated value output, wherein the ground fault detection system is configured to command an action based on the ground fault.

11. The system of claim 10, wherein the ground fault detection system comprises the linear filter configured to linearly filter the one or more signals, a rectifier configured to rectify the linear filter output, a gain circuit configured to apply the gain with a factor between 1 and 5, and a fault indicator system configured to indicate the ground fault.

12. The system of claim 10, wherein the FNV signal comprises voltage signals having multiple different frequency components, and the FNV is based on three phase voltage signals.

13. The system of claim 10, wherein the linear filter is configured to apply a continuous time transfer function, a discrete time transfer function, or a combination thereof.

14. The system of claim 10, wherein the static starter system comprises a power module having a direct current (DC) link reactor, a source bridge converter, a load bridge, and a bus, and wherein the one or more signals are incoming from the DC link reactor, the source bridge converter, the load bridge, the bus, or a combination thereof.

15. The system of claim 10, wherein the action comprises tripping the static starter system, the electrical generator, the motor, the turbine, or a combination thereof.

16. A method, comprising:

receiving one or more signals from a static starter system during operations of the static starter system;

linearly filtering the one or more signals via a linear filter to produce a linear filter output, wherein the linear filter comprises a recursive linear filter having poles and zeroes tuned to allow a selected frequency component from the input, the selected frequency component is between 2 to 5 times a load frequency, the input comprises a false neutral voltage (FNV) signal, and the linear filter comprises a biquad filter;

rectifying the linear filter output to produce a rectified output;

applying a gain to the rectified output to produce a gain output;

detecting a ground fault based on the gain output, and tripping a system based on the detection of the ground fault.

17. The method of claim 16, wherein the FNV signal comprises voltage signals having multiple different frequency components, and the FNV is based on three phase voltage signals.

18. The method of claim 16, wherein the linearly filtering comprises applying a continuous time transfer function, a discrete time transfer function, or a combination thereof, configured to allow between 2 to 5 times the load frequency.

19. The method of claim 16, comprising deriving mean value and/or an integrated value from the gain output to produce a mean value output or an integrated value output, wherein the detecting the ground fault is based on the mean value output and/or the integrated value output.

20. The method of claim 16, wherein the static starter system is configured to provide a variable frequency AC signal to drive an electrical generator or a motor during a starting sequence of a turbine.

* * * * *